US010090232B1

(12) United States Patent
Chen (10) Patent No.: US 10,090,232 B1
(45) Date of Patent: Oct. 2, 2018

(54) BUMPLESS FAN-OUT CHIP STACKING STRUCTURE AND METHOD FOR FABRICATING THE SAME

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/810,256

(22) Filed: Nov. 13, 2017

(51) Int. Cl.
*H01L 23/498* (2006.01)
*H01L 23/00* (2006.01)
*H01L 23/528* (2006.01)

(52) U.S. Cl.
CPC .. *H01L 23/49811* (2013.01); *H01L 23/49827* (2013.01); *H01L 23/528* (2013.01); *H01L 24/11* (2013.01); *H01L 2225/06513* (2013.01); *H01L 2225/1041* (2013.01)

(58) Field of Classification Search
CPC ............. H01L 23/49811; H01L 23/528; H01L 23/49827; H01L 24/11; H01L 2225/1041; H01L 2225/06513
See application file for complete search history.

(56) References Cited

U.S. PATENT DOCUMENTS

| 8,836,137 | B2 | 9/2014 | Chen |
| 8,872,326 | B2 | 10/2014 | Lin et al. |
| 8,878,360 | B2 * | 11/2014 | Meyer ............... H01L 23/49816 257/678 |
| 8,970,047 | B2 | 3/2015 | Chen |
| 9,691,726 | B2 | 6/2017 | Cheng et al. |
| 2017/0098629 | A1 | 4/2017 | Liu et al. |
| 2017/0133351 | A1 | 5/2017 | Su et al. |
| 2017/0186711 | A1 | 6/2017 | Fang et al. |
| 2017/0186737 | A1 | 6/2017 | Fang et al. |

FOREIGN PATENT DOCUMENTS

| TW | 201714264 A | 4/2017 |
| TW | 201730989 A | 9/2017 |

OTHER PUBLICATIONS

TIPO Office Action dated May 11, 2018 in Taiwan application (No. 106139198).

* cited by examiner

*Primary Examiner* — David Vu
(74) *Attorney, Agent, or Firm* — McClure, Qualey & Rodack, LLP (57) ABSTRACT

A bumpless fan-out chip stacking structure includes a first die disposed on the substrate, a first dielectric layer conformally covering on the first die, a first RDL disposed on the first dielectric layer, a first via plug electrically connecting the first die to the first RDL, a first capping layer conformally covering on the first RDL, a second die attached on the first capping layer, a second dielectric layer conformally covering on the second die, a second RDL disposed on the second dielectric layer, a second via plug electrically connecting the second die to the second RDL, a second capping layer conformally covering on the second RDL, a patterned conductive layer disposed on the second capping layer and an interlayer connection structure electrically connecting the patterned conductive layer to the first RDL and the second RDL respectively.

10 Claims, 7 Drawing Sheets

BUMPLESS FAN-OUT CHIP STACKING STRUCTURE AND METHOD FOR FABRICATING THE SAME

BACKGROUND OF THE INVENTION

Field of the Invention

The invention relates in general to a three-dimensional (3D) package structure and the method for fabricating the same, and more particularly to a bumpless fan-out chip stacking structure and the method for fabricating the same.

Description of the Related Art

As the trend of the portable electronic products pursuing more signal processing capabilities, higher storage capacity and flexibility, there is a need to integrate various integrated circuits (ICs) with different functions, such as digital logic ICs, memory ICs, analog/radio-frequency (RF) ICs, or the like, and passive components, such as capacitors, resistors, connectors, antennas or the like, to form a multi-chip module (MCM). Especially in the mobile communication electronics applications, circuit integration formed on printed circuit boards (PCBs) is not applicable for providing a device with small volume and low power consumption. System single-chip (System-on-a-chip, SoC), system-in-package (System in Package, SIP) and other three-dimensional packaging technology are thus provided.

The SoC is a technology for integrating various devices (functions) of a complete computer system (for example, including the central processing unit (CPU), memory, graphics processor and peripheral circuits, etc.) into a single chip. With the rapid development of semiconductor process technology, the critical dimension (CD) continues to shrink from micrometer to nanometer, and the number of components accommodated in a single chip is increased. However, the costs and time for forming a SoC chip are increased steeply due to the processing difficulty of the CD shrinkage technology and the technical bottlenecks of heterogeneous integration.

The SIP is a technology for integrating a number of packaged chips formed by different processes, materials into a system, which has advantages of miniaturized volume, good heterogeneous integration, lower system cost, shorten time to market, and improved product performance. However, since the subtracts of different packaged chips are connected with each other by interconnection formed of wire bonding and flip chip technology which requires additional space reserved for bonding wires and bond pads, thus the package volume is hard to shrink when more and more packaged chips are integrated in the system. In addition, the flip chip technology using solder bumps to connected packaged chips requires more thermal budget and the solder bumps used to connect the packaged chips disposed at the bottom of the package may overflow or being damaged due to excessive thermal stress which is applied to integrate more packaged chips to the system, and the system may be thus failure.

Therefore, there is a need of providing an improved bumpless fan-out chip stacking structure and the method for fabricating the same to obviate the drawbacks encountered from the prior art.

SUMMARY OF THE INVENTION

According to one embodiment of the present disclosure, a bumpless fan-out chip stacking structure is provided, wherein the bumpless fan-out chip stacking structure includes a substrate, a first die, a first dielectric layer, a redistribution layer (RDL), a first via plug, a first capping layer, a second die, a second dielectric layer, a second RDL, a second via plug, a second capping layer, a patterned conductive layer and an interlayer connection structure. The first die is disposed on the substrate. The first dielectric layer conformally covers on and contacts to the first die and the substrate. The first RDL disposed on the first dielectric layer. The first via plug passes through the first dielectric layer and electrically connects the first die to the first RDL. The first capping layer conformally covers on and contacts to the first RDL and the first dielectric layer. The second die is attached on the first capping layer. The second dielectric layer conformally covers on and contacts to the second die and the first capping layer. The second RDL is disposed on the second dielectric layer. The second via plug passes through the second dielectric layer and electrically connects the second die to the second RDL. The second capping layer conformally covers on and contacts to the second RDL and the second dielectric layer. The patterned conductive layer is disposed on the second capping layer. The interlayer connection structure electrically connects the patterned conductive layer to the first RDL and the second RDL respectively.

According to another embodiment of the present disclosure, a method for fabricating a bumpless fan-out chip stacking structure is provided, wherein the method includes steps as follows: Firstly, a substrate is provided and at least one first die is then fixed on the substrate. A first dielectric layer is formed conformally covering on and contacting to the first die and the substrate. A first RDL is formed on the first dielectric layer, and at least one first via plug passing through the first dielectric layer is formed to electrically connect the first die to the first RDL. A first capping layer is formed conformally covering on and contacting to the first RDL and the first dielectric layer. A second die is attached on the first capping layer. A second dielectric layer is formed conformally covering on and contacting to the second die and the first capping layer. A second RDL is formed on the second dielectric layer, and at least one second via plug passing through the second dielectric layer is formed to electrically connect the second die to the second RDL. A second capping layer is formed conformally covering on and contacting to the second RDL and the second dielectric layer. A patterned conductive layer is formed on the second capping layer. An interlayer connection structure is formed for electrically connecting the patterned conductive layer to the first RDL and the second RDL respectively.

In accordance with the aforementioned embodiments of the present disclosure, a bumpless fan-out chip stacking structure and the method for fabricating the same are provided. At least one known good die (KGD) is firstly fixed on a substrate; and a dielectric layer is then formed conformally covering on and contacting to the KGD and the substrate. Next, a RDL is formed on the dielectric layer and a via plug passing through the dielectric layer is formed to make a signal input/output (I/O) terminal of the KGD electrically connected to the RDL, whereby the I/O terminal of the KGD can be fan-out to a landing area of the RDL separated from the KGD. Thereinafter, a dielectric capping layer conformally covering on the RDL is provided to form an interconnection structure including at least one KGD and a RDL. Subsequently, the aforementioned steps using the dielectric capping layer to serve as another substrate are repeated to form a plurality of interconnection structures including at least one KGD and a RDL vertically stacked on the dielectric capping layer. Subsequently, a patterned conductive layer disposed on the chip stacking structure and an interlayer connection structure passing through the chip stacking structure are formed to make the landing areas of the RDLs respectively electrically connect to the patterned conductive layer; and the patterned conductive layer can be then electrically to external devices.

Because the KGDs of the bumpless fan-out chip stacking structure can be directly packaged by the dielectric layer and the capping layer conformally covering on the substrate. Additional substrates for prepackaging the KGDs are no longer necessary. Such that the process for form the chip stacking structure can be simplified and the package volume can be reduced. In addition, since the KGDs integrated in the chip stacking structure can be connected with each other by the interconnection structures formed without any bonding wire or solder bump, thus the additional space reserved for bonding wires and bond pads is also no longer necessary, and more KGDs can be integrated in the chip stacking structure without increasing the package volume, in comparison with the prior art. As a result, the package density of the chip stacking structure can be significantly increased.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings.

DETAILED DESCRIPTION OF THE INVENTION

A bumpless fan-out chip stacking structure and the method for fabricating the same is provided to simplify the process for form the chip stacking structure and to decrease the package volume of the chip stacking structure. A number of embodiments of the present disclosure are disclosed below with reference to accompanying drawings.

However, the structure and contents disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

Figure 1A:
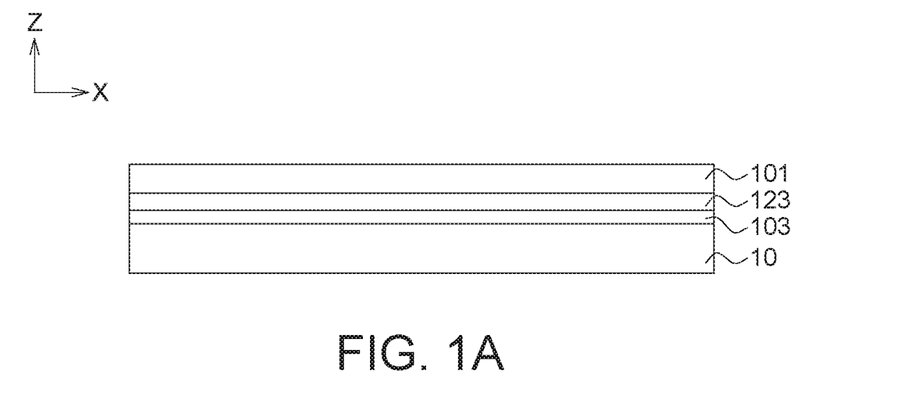
FIGS. 1A to 1J are cross-sectional views illustrating the processing structures for fabricating a bumpless fan-out chip stacking structure, in accordance with one embodiment of the present disclosure.
Figure 1B:
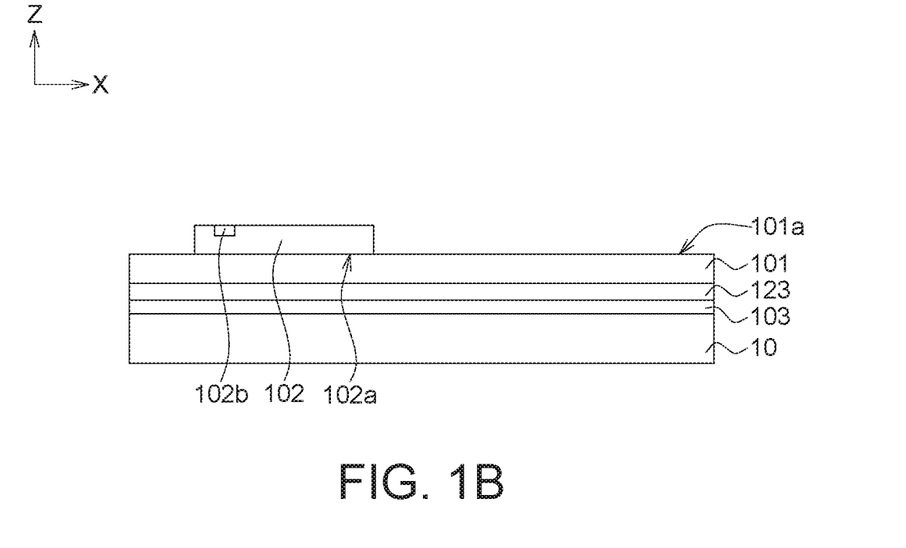

FIGS. 1A to 1J are cross-sectional views illustrating the processing structures for fabricating a bumpless fan-out chip stacking structure 100, in accordance with one embodiment of the present disclosure. In some embodiments of the present disclosure, the method for forming the bumpless fan-out chip stacking structure 100 includes steps as follows:

Firstly, a substrate 101 is provided. In some embodiments of the present disclosure, the substrate 101 may be made of dielectric material, such as silicon oxide, silicon nitride, plastic material or the like. In the present embodiment, the substrate 101 can be a plastic film, such as a polyimide (PI) film, formed on a carrier substrate 10 by a spin coating process, a deposition process or an adhesion process.

In one embodiment, an optical release film 103 may be formed on the carrier substrate 10 prior to the forming of the substrate 101. In the present embodiment, the release film 103 can be a plastic film disposed between the substrate 101 and the carrier substrate 10 (see FIG. 1A). In one embodiment, an optical dielectric film 123 may be further formed on the release film 103 prior to the forming of the substrate 101. In the present embodiment, the dielectric film 123 can be a silicon oxide layer disposed between the substrate 101 and the release film 103.

Next, at least one first die 102 is fixed on and directly contacting to the substrate 101. In some embodiments of the present disclosure, the first die 102 is a KGD, an unpackaged part or a bare die that is verified and meets a given specification. The first die 102 has a thickness, measured from its' backside 104a to the opposite front side, substantially less than 50 μm. In the present embodiment, the thickness of the first die 102 may range from 25 μm to 30 μm. The first die 102 is fixed on the substrate 101 by flipping the backside 102a of the first die 102 downward to face the surface 101a of the substrate 101, and then attaching the backside 102a onto the surface 101a of the substrate 101, whereby the I/O terminal 102b of the first die 102 that is disposed on front side of the first die 102 can be exposed (see FIG. 1B).

Figure 1C:
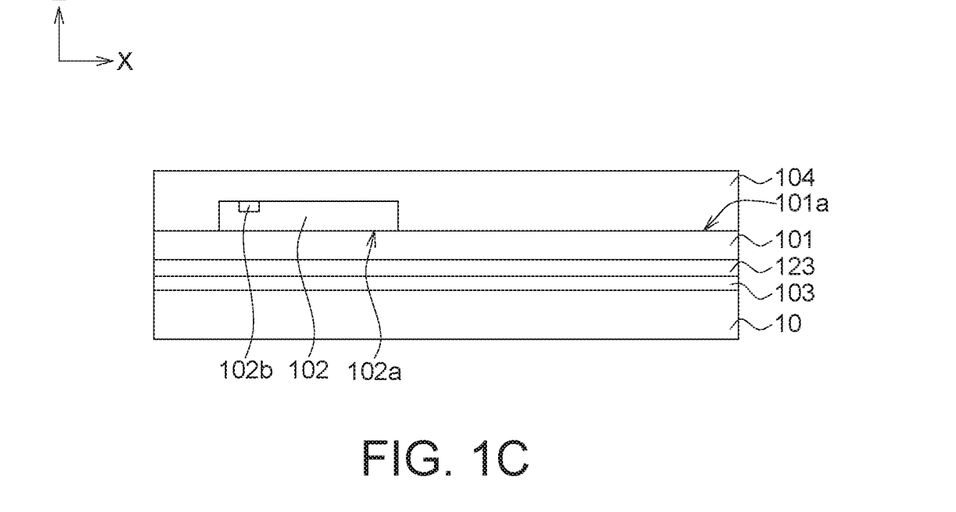

A first dielectric layer 104 is then formed conformally covering on the first die 102 and contacting to the substrate 101 (see FIG. 1C). In some embodiments of the present disclosure, the first dielectric layer 104 can be made of any kind of material. For example, in the present embodiment, the first dielectric layer 104 can be a silicon dioxide layer formed by a deposition process. The first dielectric layer 104 has a thickness substantially less than 50 μm. However, the material, dimension and the method for fabricating the first dielectric layer 104 may not be limited to these regards. For example, the first dielectric layer 104 may be made of silicon nitride or plastic material. In some embodiments, the first dielectric layer 104 may be formed by a spin coating process performed on the front side of first die 102 and the surface 101a of the substrate 101. In another embodiment, the first dielectric layer 104 may be formed by attaching a tape made of dielectric material directly on the front side of first die 102 and the surface 101a of the substrate 101.

Figure 1D:
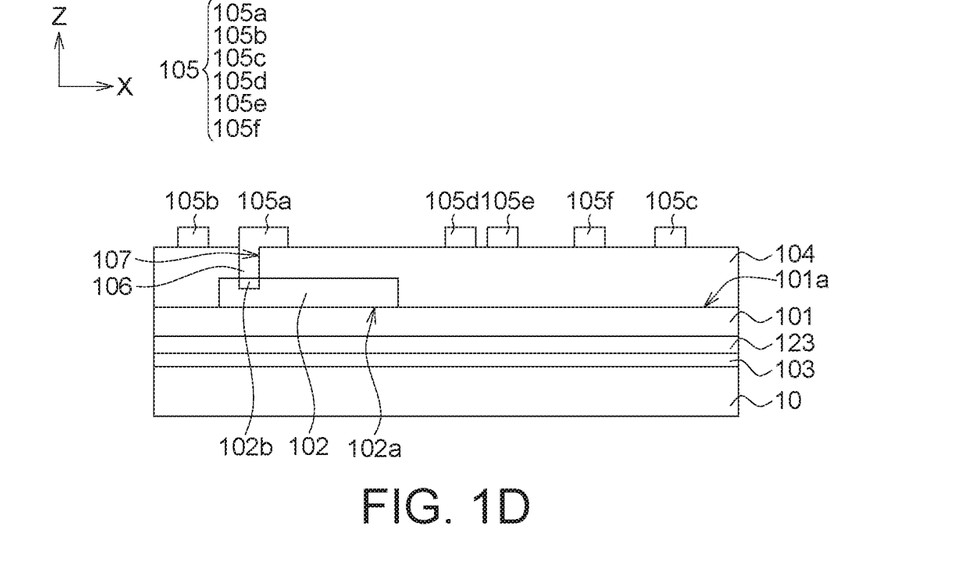

Thereafter, a first RDL 105 is formed on the first dielectric layer 104, and at least one first via plug 106 passing through the first dielectric layer 104 is formed to electrically connect the first die 102 to the first RDL 105 (see FIG. 1D). In some embodiments of the present disclosure, the forming of the first RDL 105 may include steps as follows: A metal layer (such as, a copper layer or an aluminum layer) is firstly formed on the first dielectric layer 104 by a metal deposition process. The metal layer is then patterned by at least one etching process to expose a portion of the first dielectric layer 104, wherein the first RDL 105 includes at least one connection portion 105a, at least one landing area 105b and at least one wire portion (not shown) connecting the landing area 105b to the connection portion 105a.

The forming of the first via plug 106 includes steps as follows: Prior to the forming of the first RDL 105, at least on through-hole 107 aligning the I/O terminal 102b of the first die 102 and passing through the first dielectric layer 104 is formed to make the I/O terminal 102*b* exposed there from. The through-hole 107 is then fulfilled by the material used for forming the first RDL 105, whereby the first via plug 106 can be formed simultaneous to the first RDL 105 and electrically contacts to the first RDL 105. In the present embodiment, the both of the connection portion 105*a* of the first RDL 105 and the I/O terminal 102*b* of the first die 102 vertically (along the z axis) overlap with and electrically contact to the first via plug 106. The landing area 105*b* laterally (along the X axis) separated from the first die 102. In other words, the I/O terminal 102*b* of the first die 102 can be electrically connected to the landing area 105*b* of the first RDL 105 through the first via plug 106, the connection portion 105*a* and the wire portion (not shown) connecting the landing area 105*b* to the connection portion 105*a*. The I/O terminal 102*b* of the first die 102 can be fan-out to the landing area 105*b* of the first RDL 105 laterally separated from the first die 102 through the interconnection structure configured by the first RDL 105 and the first via plug 106. In one embodiment of the present disclosure, the first via plug 106 has a cross-sectional diameter (perpendicular to the Z axis) substantially about 2 μm.

Figure 1E:
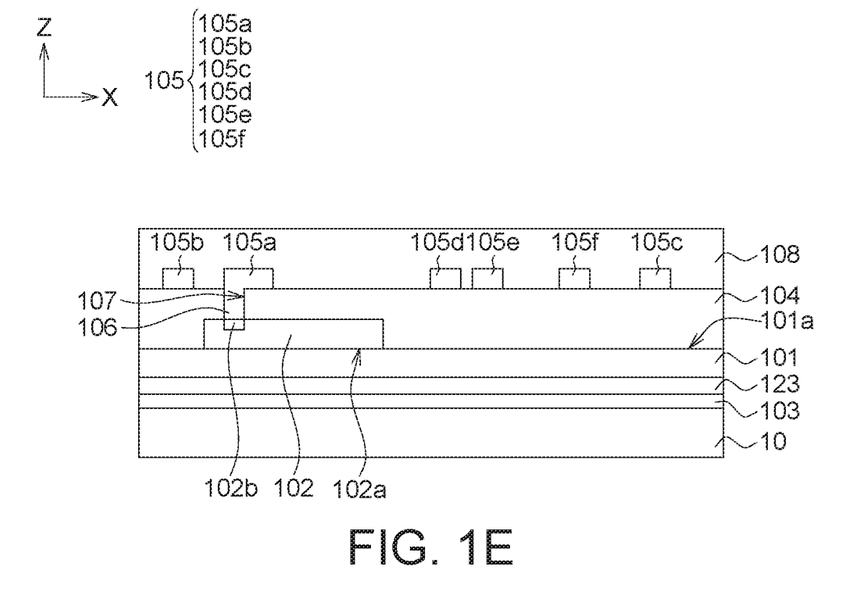
Figure 1F:
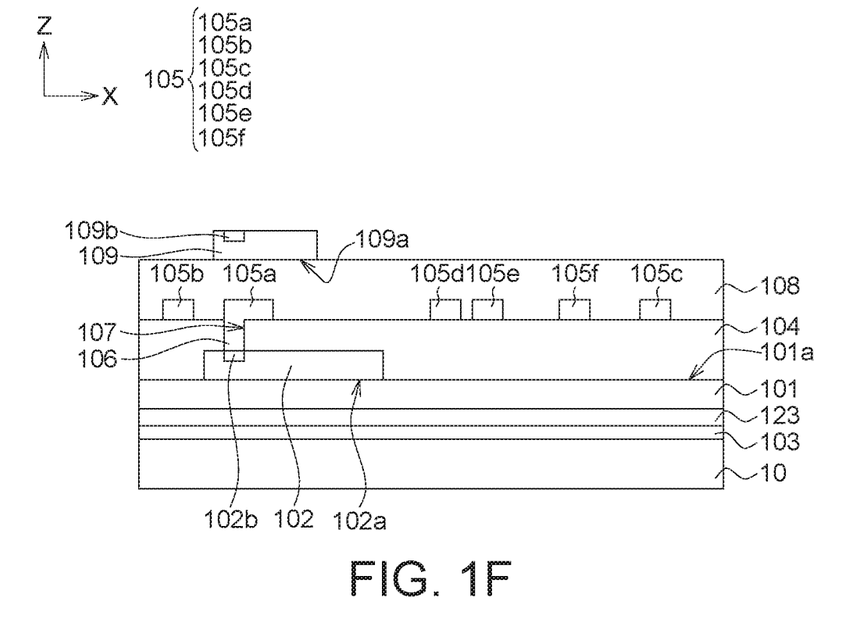
Figure 1G:
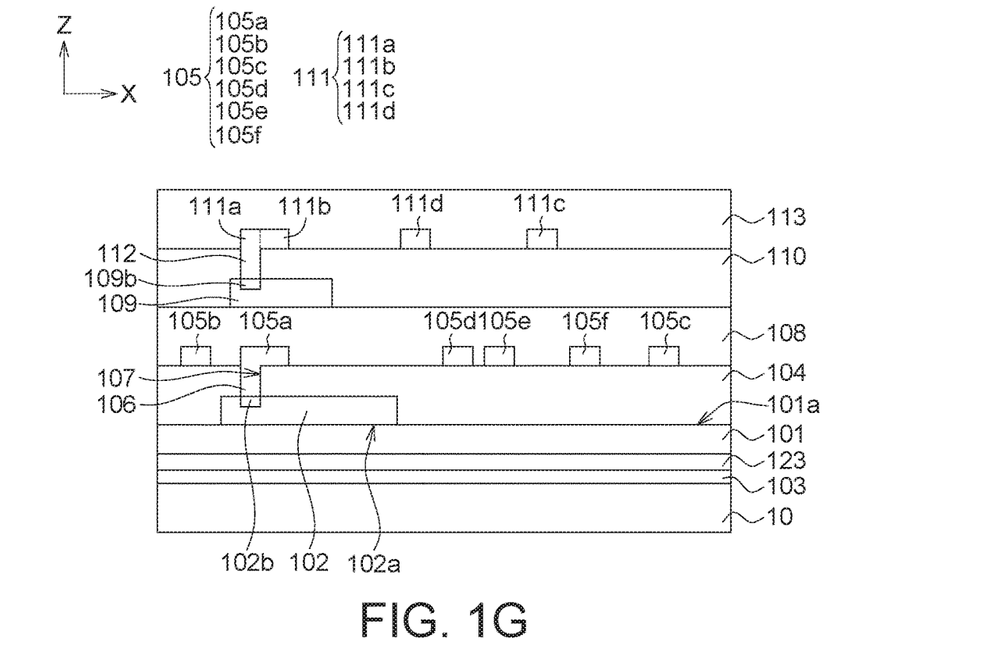
Figure 1H:
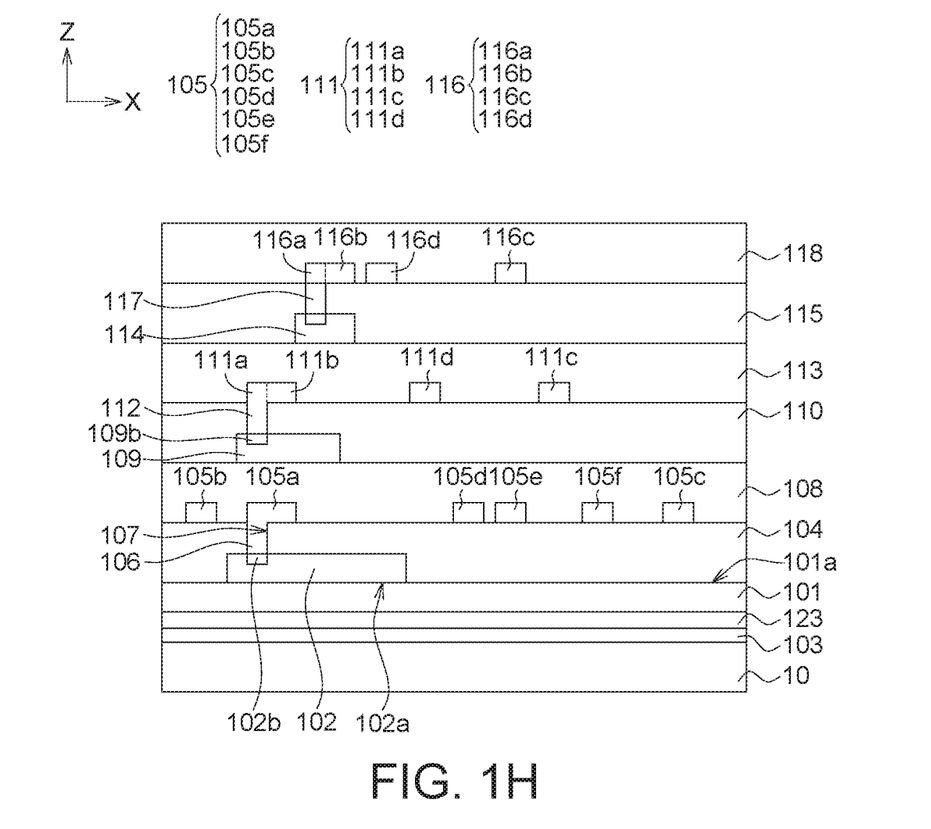

A first capping layer 108 is then formed conformally covering on and contacting to the first RDL 105 and the first dielectric layer 104 (see FIG. 1E). In some embodiments of the present disclosure, the material and the method for forming the first capping layer 108 can be identical to or different form that for forming the first dielectric layer 104.

Next, at least one second die 109 is attached on the first capping layer 108. In some embodiments of the present disclosure, the second die 109 can be also a verified KGD. The second die 109 has a thickness substantially less than 50 μm. In the present embodiment, the thickness of the second die 109 may range from 25 μm to 30 μm. Like to the first die 102, the second die 109 can be fixed on the first capping layer 108 by flipping the backside 109*a* of the second die 109 downward to face the first capping layer 108, and then attaching the backside 109*a* onto the first capping layer 108, whereby the I/O terminal 109*b* of the second die 109 that is disposed on front side of the second die 109 can be exposed (see FIG. 1F).

Thereinafter, a second dielectric layer 110 is formed conformally covering on and contacting to the second die 109 and the first capping layer 108. A second RDL 111 is formed on the second dielectric layer 110, and at least one second via plug 112 passing through the second dielectric layer 110 is formed to electrically connect the I/O terminal 109*b* of the second die 109 to the second RDL 111. A second capping layer 113 is formed conformally covering on and contacting to the second RDL 111 the second dielectric layer 110. Similarly, the I/O terminal 109*b* of the second die 109 can be fan-out to the landing area 111*b* of the second RDL 111 along a direction (not shown) perpendicular to the X-Z plane and laterally separated from the second die 109 through the interconnection structure configured by the connection portion 111*a*, the landing area 111*b* and the wire portion (not shown) of the second RDL 111 as well as the second via plug 112 (see FIG. 1G). Since the material and method for forming the second dielectric layer 110, the second RDL 111, the second via plug 112 and the second capping layer 113 are identical to that for forming the first dielectric layer 104, the first RDL 105, the first via plug 106 and the first capping layer 108, thus it well not redundantly described here.

Subsequently, the steps as mentioned above can be repeated to attaching at least one third die 114 on the second capping layer 113 and to form a third dielectric layer 115, a third RDL 116 (at least including a connection portion 116*a* and a landing area 116*b*), a third via plug 117 and a third capping layer 118 on the second capping layer 113. In some embodiments of the present disclosure, the landing area 105*b* of the first RDL 105 does not overlap with the first die 102, the second die 109, the third die 114, the second RDL 111 and the third RDL 116; and the landing area 111*b* of the second RDL 111 does not overlap with the second die 109, the third die 114 and the third RDL 116.

However, it should be appreciated that the agreements of the first RDL 105, the second RDL 111 and the third RDL 116 may not be limited to these regards. In some embodiments of the present disclosure, the first RDL 105, the second RDL 111 and the third RDL 116 may include other landing areas respectively; and portions of the landing areas may overlap with one another. For example, in the present embodiment, the first RDL 105 further includes landing areas 105*c*, 105*d* and 105*e*; the second RDL 111 further includes landing areas 111*c* and 111*d*; and the third RDL 116 further includes landing areas 116*c* and 116*d*. Wherein the landing area 105*e* of the first RDL 105 overlaps with the landing area 116*c* of the third RDL 116 (see FIG. 1H).

A patterned conductive layer 119 and an interlayer connection structure 120 are then formed on the third capping layer 118 for electrically connecting the patterned conductive layer to the first RDL 105 the second RDL 111 and the third RDL 116 respectively. In some embodiments of the present disclosure, the forming of the patterned conductive layer 119 and the interlayer connection structure 120 includes steps as follows:

The third capping layer 118 is firstly patterned by an etching process to form a plurality of openings 121*a*-121*f* extending into the third capping layer 118 from the top surface of the third capping layer 118. A plurality through-holes 122*a*-122*j* are then formed in the openings 121*a*-121*f* by at least one etching process respectively passing through the third capping layer 118, the third RDL 116, the third dielectric layer 115, the second capping layer 113, the second RDL 111, second dielectric layer 110 and the second capping layer 108, so as to correspondingly expose the landing areas 105*b*, 105*c* and 105*d* of the first RDL 105, the landing areas 111*b*, 111*c* and 111*d* of the second RDL 111 and the landing areas 116*b*, 116*c* and 116*d* of the third RDL 116.

Figure 1I:
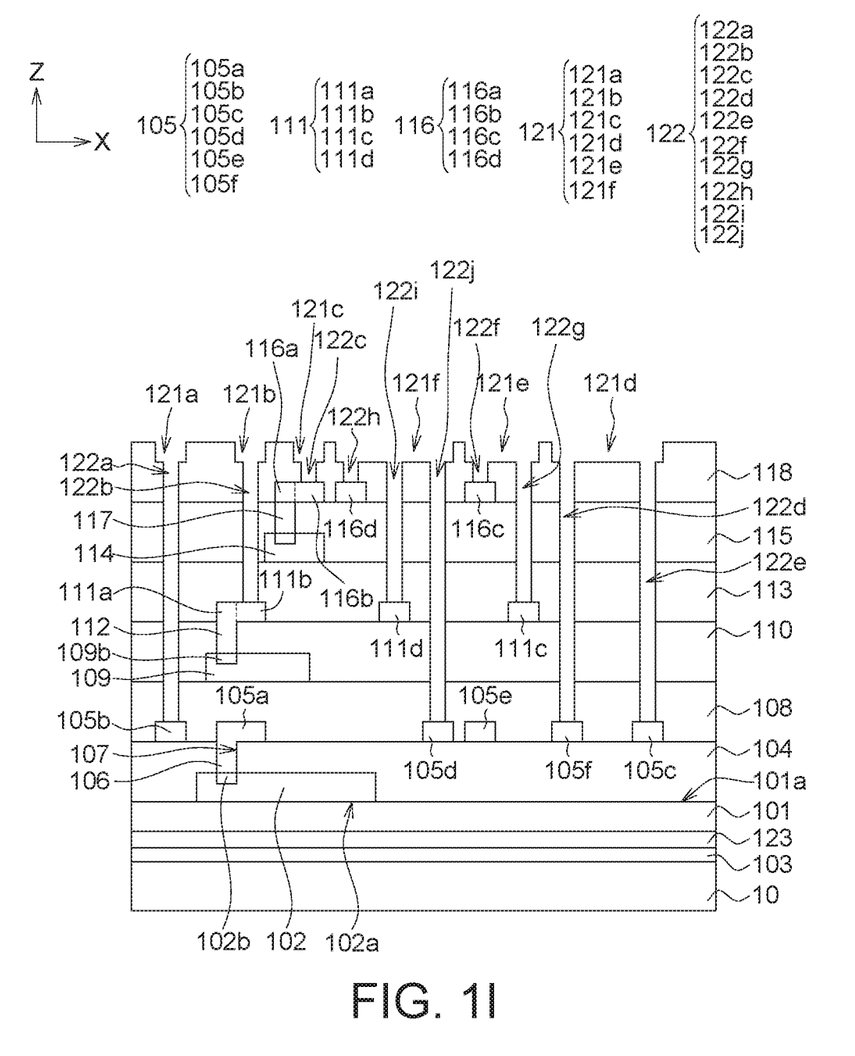

In the present embodiment, the through-hole 122*a* is formed in the opening 121*a* from which the landing area 105*b* of the first RDL 105 is exposed; the through-hole 122*b* is formed in the opening 121*b* from which the landing area 111*b* of the second RDL 111 is exposed; the through-hole 122*c* is formed in the opening 121*c* from which the landing area 116*b* of the third RDL 116 is exposed; the through-holes 122*d* and 122*e* are formed in the opening 121*d* from which the landing area 116*c* of the third RDL 116 and the landing area 105*c* of the first RDL 105 are respectively exposed; the through-holes 122*f* and 122*g* are formed in the opening 121*e* from which the landing area 116*d* of the third RDL 116 and the landing area 111*c* of the second RDL 111 are respectively exposed; and the through-holes 122*h*, 122*i* and 122*j* are formed in the opening 121*f* from which the landing area 105*d* of the first RDL 105, the landing area 111*d* of the second RDL 111 and the landing area 116*d* of the third RDL 116 are respectively exposed (see FIG. 1I).

In some embodiments of the present disclosure, the through-holes that have identical depth, such as the through-holes 122*a*, 122*d* and 122*e* may be formed by the same etching process. In the present embodiment, the through-holes 122*d* and 122*e* having identical depth can be formed by an etching process in the same opening 121*d*, and the through-hole 122*a* is formed by the same etching process in the opening 121*a* simultaneously. Alternatively, in some other embodiments, the through-holes 122*d* and 122*e* having identical depth can be formed in the same opening 121*d* by different etching processes carried out at different times. In some embodiments of the present disclosure, the through-holes that have different depths (such as the through-holes 122*h*, 122*i* and 122*j*) may be formed in the same opening (such as the opening 121*f*) by the same etching process. Alternatively, these through-holes 122*h*, 122*i* and 122*j* can be formed in the same opening 121*f* by different etching processes carried out at different times.

Figure 1J:
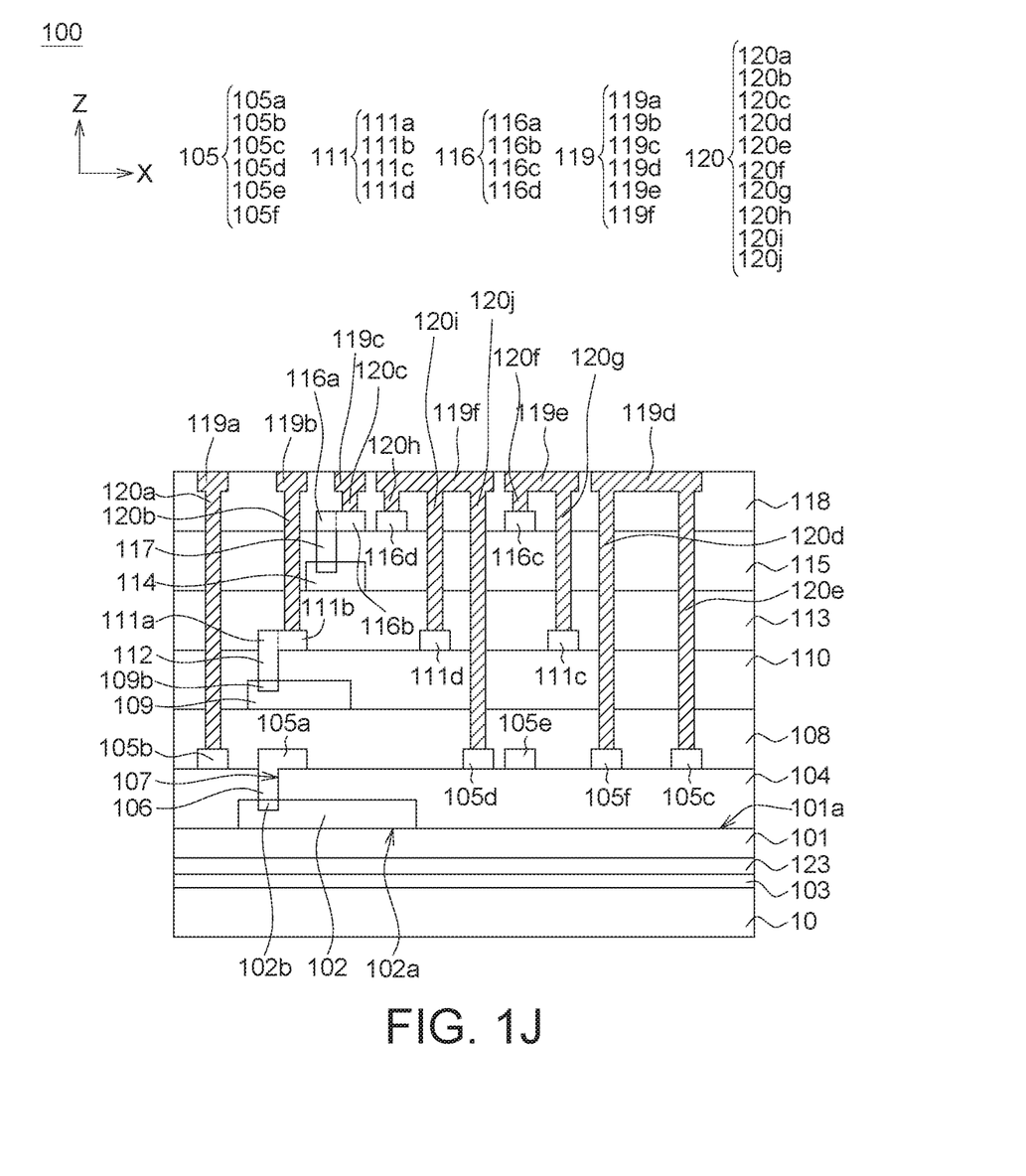

Subsequently, conductive material, such as copper, aluminum, tungsten or the combinations thereof, can be formed and covering on the third capping layer 118 to fulfill the through-holes 122*a*-122*j* and the openings 121*a*-121*f*. A planarization process, such as a chemical-mechanical polishing (CMP) using the third capping layer 118 as a stop layer is then performed to remove a portion of the conductive material, so as to form the patterned conductive layer 119 and an interlayer connection structure 120. After a serious downstream process (no shown) are carried out, the release 103 can be denaturized by a UV curing or a thermal treatment to release the carrier substrate 10. Meanwhile, the bumpless fan-out chip stacking structure 100, as depicted in FIG. 1J can be implemented.

In the present embodiment, the patterned conductive layer 119 includes a plurality of conductive portions 119*a*-119*f* respectively formed in the openings 121*a*-121*f*. The interlayer connection structure 120 includes a plurality of interlayer contacts 120*a*-120*j* respectively formed in the through-holes 122*a*-122*j*. Wherein the interlayer contact 120*a* electrically connects the landing area 105*b* of the first RDL 105 to the conductive portion 119*a* of the patterned conductive layer 119; the interlayer contact 120*b* electrically connects the landing area 111*b* of the second RDL 111 to the conductive portion 119*b* of the patterned conductive layer 119; the interlayer contact 120*c* electrically connects the landing area 116*b* of the third RDL 116 to the conductive portion 119*c* of the patterned conductive layer 119; the interlayer contact 120*d* electrically connects the landing area 105*f* of the first RDL 105 to the conductive portion 119*d* of the patterned conductive layer 119; the interlayer contact 120*e* electrically connects the landing area 105*c* of the first RDL 105 to the conductive portion 119*d* of the patterned conductive layer 119; the interlayer contact 120*f* electrically connects the landing area 116*c* of the third RDL 116 to the conductive portion 119*e* of the patterned conductive layer 119; the interlayer contact 120*g* electrically connects the landing area 111*c* of the second RDL 111 to the conductive portion 119*e* of the patterned conductive layer 119; the interlayer contact 120*h* electrically connects the landing area 116*d* of the third RDL 116 to the conductive portion 119*f* of the patterned conductive layer 119; the interlayer contact 120*i* electrically connects the landing area 111*d* of the second RDL 111 to the conductive portion 119*f* of the patterned conductive layer 119; and the interlayer contact 120*j* electrically connects the landing area 105*d* of the first RDL 105 to the conductive portion 119*f* of the patterned conductive layer 119.

However, the connections of the patterned conductive layer 119 and the interlayer connection structure 120 are not limited to these regards. In some other embodiments, the landing areas of the first RDL 105, the second RDL 111 and the third RDL 116, the conductive portions 119*a*-119*f* of the patterned conductive layer 119 and the interlayer contacts 120*a*-120*j* of the interlayer connection structure 120 can be rearranged and allocated to provide different interconnection structures between the first die 102, the second die 109 and the third die 114 according to the device design.

Because, the process for fabricating the bumpless fan-out chip stacking structure 100 requires no KGDs prepackaging steps applying additional substrate to package the first die 102, the second die 109 and the third die 114; and the interconnection structure formed between the first die 102, the second die 109 and the third die 114 can be used to take the place of the bonding wires or solder bumps applied by the prior art, the space originally occupied by bonding wires and bond pads can be saved to allow more KGDs being integrated in the chip stacking structure 100 without increasing the package volume. The package density of the bumpless fan-out chip stacking structure 100 can be increased. In addition, since no solder bump is applied to form the interconnection structure among the first die 102, the second die 109 and the third die 114, thus the thermal budget of the bumpless fan-out chip stacking structure 100 can be decreased and the solder reflow problems due to excessive thermal stress may be avoided.

In accordance with the aforementioned embodiments of the present disclosure, a bumpless fan-out chip stacking structure and the method for fabricating the same are provided. At least one known good die (KGD) is firstly fixed on a substrate; and a dielectric layer is then formed conformally covering on and contacting to the KGD and the substrate. Next, a RDL is formed on the dielectric layer and a via plug passing through the dielectric layer is formed to make a signal input/output (I/O) terminal of the KGD electrically connected to the RDL, whereby the I/O terminal of the KGD can be fan-out to a landing area of the RDL separated from the KGD. Thereinafter, a dielectric capping layer conformally covering on the RDL is provided to form an interconnection structure including at least one KGD and a RDL. Subsequently, the aforementioned steps using the dielectric capping layer to serve as another substrate are repeated to form a plurality of interconnection structures including at least one KGD and a RDL vertically stacked on the dielectric capping layer. Subsequently, a patterned conductive layer disposed on the chip stacking structure and an interlayer connection structure passing through the chip stacking structure are formed to make the landing areas of the RDLs respectively electrically connect to the patterned conductive layer; and the patterned conductive layer can be then electrically to external devices.

Because the KGDs of the bumpless fan-out chip stacking structure can be directly packaged by the dielectric layer and the capping layer conformally covering on the substrate. Additional substrates for prepackaging the KGDs are no longer necessary. Such that the process for form the chip stacking structure can be simplified and the package volume can be reduced. In addition, since the KGDs integrated in the chip stacking structure can be connected with each other by the interconnection structures formed without any bonding wire or solder bump, thus the additional space reserved for bonding wires and bond pads is also no longer necessary, and more KGDs can be integrated in the chip stacking structure without increasing the package volume, in comparison with the prior art. As a result, the package density of the chip stacking structure can be significantly increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bumpless fan-out chip stacking structure comprising:
   a substrate;
   at least one first die, disposed on the substrate;
   a first dielectric layer, conformally covering on and contacts to the first die and the substrate;
   a first redistribution layer (RDL), disposed on the first dielectric layer;
   at least one first via plug, passing through the first dielectric layer and electrically connecting the first die to the first RDL;
   a first capping layer, conformally covering on and contacting to the first RDL and the first dielectric layer;
   at least one second die, attached on the first capping layer;
   a second dielectric layer, conformally covering on and contacting to the second die and the first capping layer;
   a second RDL, disposed on the second dielectric layer;
   at least one second via plug, passing through the second dielectric layer and electrically connecting the second die to the second RDL;
   a second capping layer, conformally covering on and contacting to the second RDL and the second dielectric layer;
   a patterned conductive layer, disposed on the second capping layer; and
   an interlayer connection structure, electrically connecting the patterned conductive layer to the first RDL and the second RDL respectively.

2. The bumpless fan-out chip stacking structure according to claim 1, wherein the interlayer connection structure comprises:
   a first interlayer contact, passing through the second capping layer, the second dielectric layer and the first capping layer to electrically connect a first conductive portion of the patterned conductive layer to a first landing area of the first RDL; and
   a second interlayer contact, passing through the second capping layer to electrically connect a second conductive portion of the patterned conductive layer to a second landing area of the second RDL;
   wherein the first landing area does not overlap with the second die and the second RDL.

3. The bumpless fan-out chip stacking structure according to claim 2, wherein the interlayer connection structure further comprises:
   a third interlayer contact, passing through the second capping layer, the second dielectric layer and the first capping layer to electrically connect a third conductive portion of the patterned conductive layer to a third landing area of the first RDL isolated from the first landing area; and
   a fourth interlayer contact, passing through the second capping layer, the second dielectric layer and the first capping layer to electrically connect the third conductive portion to a fourth landing area of the first RDL;
   wherein the first landing area, the third landing area and the fourth landing area are isolated from each other.

4. The bumpless fan-out chip stacking structure according to claim 2, wherein the interlayer connection structure further comprises:
   a third interlayer contact, passing through the second capping layer, the second dielectric layer and the first capping layer to electrically connect a third conductive portion of the patterned conductive layer to a third landing area of the first RDL isolated from the first landing area; and
   a fourth interlayer contact, passing through the second capping layer to electrically connect the third conductive portion to a fourth landing area of the second RDL.

5. A method for fabricating a bumpless fan-out chip stacking structure, comprising:
   providing a substrate;
   fixing at least one first die on the substrate;
   forming a first dielectric layer conformally covering on and contacts to the first die and the substrate;
   forming a first RDL on the first dielectric layer;
   forming at least one first via plug passing through the first dielectric layer and electrically connecting the first die to the first RDL;
   forming a first capping layer conformally covering on and contacting to the first RDL and the first dielectric layer;
   attaching at least one second die on the first capping layer;
   forming a second dielectric layer conformally covering on and contacting to the second die and the first capping layer;
   forming a second RDL on the second dielectric layer;
   forming at least one second via plug passing through the second dielectric layer and electrically connecting the second die to the second RDL;
   forming a second capping layer conformally covering on and contacting to the second RDL and the second dielectric layer;
   forming a patterned conductive layer on the second capping layer; and
   forming an interlayer connection structure electrically connecting the patterned conductive layer to the first RDL and the second RDL respectively.

6. The method according to claim 5, wherein the step of providing the substrate comprises:
   forming a release film on a carrier substrate; and
   forming a dielectric film on the release film.

7. The method according to claim 5, wherein the forming of the patterned conductive layer and the interlayer connection structure comprises:
   patterning the second capping layer to form a first opening and a second opening in the second capping layer;
   forming a first through-hole in the first opening and passing through the second capping layer, the second dielectric layer and the first capping layer to expose a first landing area of the first RDL;
   forming a second through-hole in the second opening and passing through the second capping layer to expose a second landing area of the second RDL; and
   filling the first opening, the second opening, the first through-hole and the second through-hole with a conductive material.

8. The method according to claim 7, wherein the patterned second capping layer further comprises a third opening and the forming of the patterned conductive layer and the interlayer connection structure further comprises:
   forming a third through-hole and a fourth through-hole in the third opening, wherein the third through-hole passes through the second capping layer, the second dielectric layer and the first capping layer to expose a third landing area of the first RDL, and the fourth through-hole passes through the second capping layer, the second dielectric layer and the first capping layer to expose a fourth landing area of the first RDL; and
   filling the third opening, the third through-hole and the fourth through-hole with the conductive material.

9. The method according to claim 7, wherein the patterned second capping layer further comprises a third opening and the forming of the patterned conductive layer and the interlayer connection structure further comprises:
- forming a third through-hole and a fourth through-hole in the third opening, wherein the third through-hole passes through the second capping layer, the second dielectric layer and the first capping layer to expose a third landing area of the first RDL, and the fourth through-hole passes through the second capping layer to expose a fourth landing area of the second RDL; and
- filling the third opening, the third through-hole and the fourth through-hole with the conductive material.

10. The method according to claim 7, wherein the patterned second capping layer further comprises a third opening and the forming of the patterned conductive layer and the interlayer connection structure further comprises:
- forming a third through-hole in the third opening and passing through the second capping layer, the second dielectric layer and the first capping layer to expose a third landing area of the first RDL;
- forming a fourth through-hole in the third opening and passing through the second capping layer to expose a fourth landing area of the second RDL; and
- filling the third opening, the third through-hole and the fourth through-hole with the conductive material.

* * * * *